United States Patent
Wu et al.

(10) Patent No.: US 9,709,904 B2
(45) Date of Patent: Jul. 18, 2017

(54) LITHOGRAPHY APPARATUS HAVING DUAL RETICLE EDGE MASKING ASSEMBLIES AND METHOD OF USE

(71) Applicant: TAIWAN SEMICONDUCTOR MANUFACTURING COMPANY, LTD., Hsinchu (TW)

(72) Inventors: Tung-Li Wu, Hsinchu (TW);
Chin-Hsiang Lin, Hsinchu (TW);
Heng-Hsin Liu, New Taipei (TW);
Jui-Chun Peng, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/748,543

(22) Filed: Jun. 24, 2015

(65) Prior Publication Data
US 2015/0293462 A1     Oct. 15, 2015

Related U.S. Application Data (63) Continuation of application No. 13/461,500, filed on May 1, 2012, now Pat. No. 9,081,297.

(51) Int. Cl.
*G03B 27/54*     (2006.01)
*G03B 27/72*     (2006.01)
*G03F 7/20*      (2006.01)

(52) U.S. Cl.
CPC ...... *G03F 7/70725* (2013.01); *G03F 7/70066* (2013.01); *G03F 7/70283* (2013.01); *G03F 7/70341* (2013.01); *G03F 7/70641* (2013.01)

(58) Field of Classification Search
CPC .......................... G03F 7/70283; G03F 7/70066
(Continued)

(56) References Cited

U.S. PATENT DOCUMENTS 5,486,896 A  *  1/1996  Hazama ............. G03F 7/70475
                                                     355/53
6,611,316 B2   8/2003  Sewell
(Continued)

FOREIGN PATENT DOCUMENTS

CN     101268420      9/2008
JP     2007287760    11/2007
(Continued)

OTHER PUBLICATIONS

Notice of Allowance dated May 20, 2014 and English translation from corresponding application No. KR 10-2012-0096978.
(Continued)

*Primary Examiner* — Hung Henry Nguyen
(74) *Attorney, Agent, or Firm* — Hauptman Ham, LLP (57) ABSTRACT

A lithography apparatus includes a plurality reticle edge masking assemblies (REMAs), wherein each REMA of the plurality of REMAs is positioned to receive one of a plurality of light beams, and each REMA of the plurality of REMAs comprises a movable slit for passing the received light beam therethrough. The lithography apparatus includes a controller for controlling a speed of the movable slit based on a size of the movable slit, an intensity of the one or more collimated light beams, or a material to be patterned. The lithography apparatus further includes a single mask having a single pattern, wherein the mask is configured to receive light from every REMA of the plurality of REMAs. The lithography apparatus includes a projection lens configured to receive light transmitted through the single mask, wherein the lithography apparatus is configured to introduce an immersion liquid into a space adjacent to the projection lens.

20 Claims, 6 Drawing Sheets

(58) Field of Classification Search
USPC ............ 355/52, 53, 55, 67–71; 356/399–401
See application file for complete search history.

(56) References Cited

U.S. PATENT DOCUMENTS

| | | |
|---|---|---|
| 6,795,168 B2 | 9/2004 | Wang et al. |
| 7,209,217 B2 | 4/2007 | Troost |
| 7,224,438 B2 | 5/2007 | Ottens et al. |
| 7,262,832 B2 | 8/2007 | Sekigawa |
| 7,884,921 B2 * | 2/2011 | Noboru ................ G02B 27/108 355/46 |
| 9,081,297 B2 * | 7/2015 | Wu ..................... G03F 7/70066 |
| 2007/0013884 A1 | 1/2007 | Kim |
| 2007/0242363 A1 | 10/2007 | Noboru et al. |
| 2008/0311529 A1 * | 12/2008 | Kondoh ................ G03F 7/2041 430/322 |
| 2009/0296052 A1 | 12/2009 | Kivits et al. |
| 2011/0091797 A1 | 4/2011 | Chang et al. |

FOREIGN PATENT DOCUMENTS

| | | |
|---|---|---|
| KR | 10-2007-0008966 | 1/2007 |
| KR | 10-2009-0096363 | 9/2009 |

OTHER PUBLICATIONS

Office Action dated Sep. 15, 2013 with English translation from corresponding application No. KR 10-2012-0096978.

\* cited by examiner

LITHOGRAPHY APPARATUS HAVING DUAL RETICLE EDGE MASKING ASSEMBLIES AND METHOD OF USE

PRIORITY CLAIM

The present application is a continuation of U.S. application Ser. No. 13/461,500, now U.S. Pat. No. 9,081,297, filed May 1, 2012, which is incorporated herein by reference in its entirety.

BACKGROUND

As technology nodes decrease, the density of features on a substrate increases. The decreased spacing between features on the substrate can result in the separation of a layout design into multiple patterns due to resolution constraints. A conventional lithographic arrangement, including a single reticle edge masking assembly, is only capable of transferring one pattern at a time.

The reticle edge masking assembly includes a slit extending across substantially the entire width of the reticle masking element. The slit can translate along a length direction, perpendicular to the width of the reticle masking element. The translation of the slit sequentially illuminates portions of a mask whose pattern is transferred to a wafer. During a patterning process, the wafer moves in a direction opposite to the direction of translation of the slit.

Often a pattern is repeated many times on a single wafer. Each time a pattern is repeated the slit is reset to an original position, or the direction of wafer movement is reversed. To maximize throughput the movement direction of the wafer is often reversed. However, this arrangement causes particles to build up on a surface of the wafer. The build up of particles can block illumination passing through the reticle masking element, resulting in an error in the pattern transfer.

In order to transfer multiple patterns to the wafer, the mask in the lithographic arrangement is replaced for each pattern, or multiple lithographic arrangements are used with each having a separate pattern. The replacement of masks or the use of multiple lithographic arrangements increases production time and cost.

DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are of course, merely examples and are not intended to be limiting.

Figure 1A:
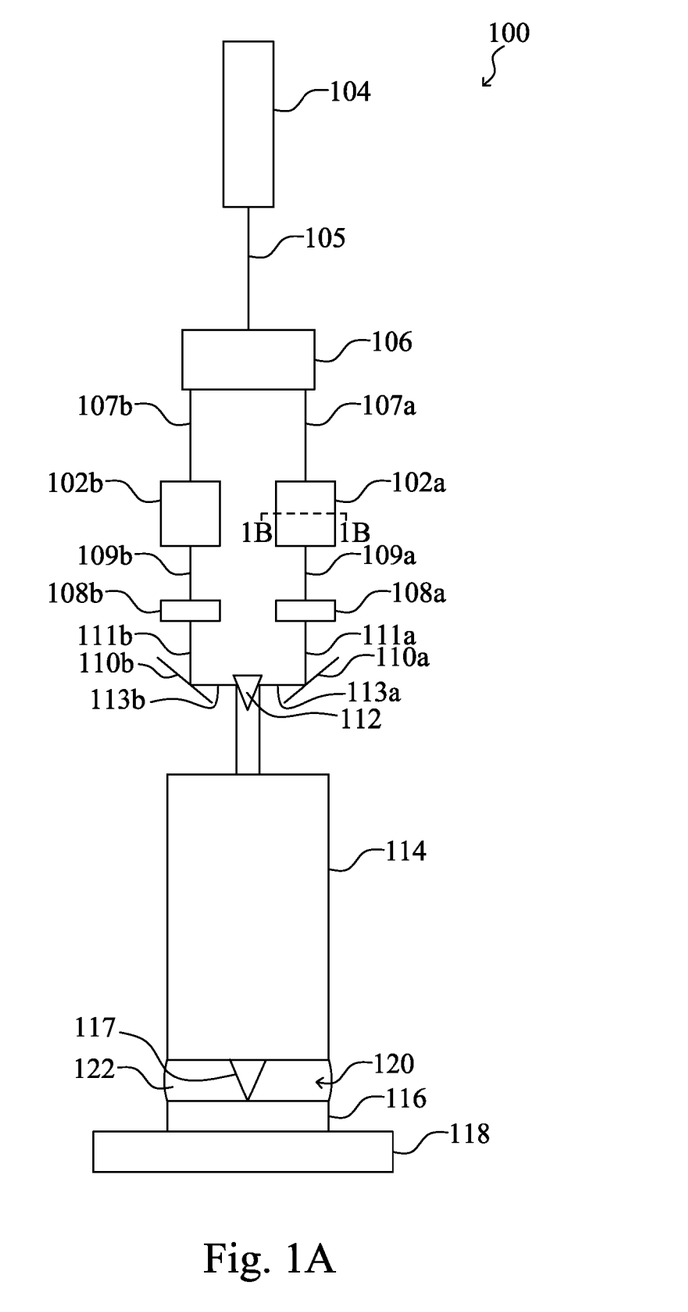
FIG. 1A is a diagram of a lithography apparatus having dual reticle edge masking assemblies according to one or more embodiments.

FIG. 1A is a diagram of a lithography apparatus 100 having dual reticle edge masking assemblies (REMAs) 102a and 102b. Lithography apparatus 100 includes a light source 104 emitting a light beam 105. A beam separating element 106 receives the light beam 105 from light source 104 and splits the light beam 105 into two collimated light beams 107a and 107b. Two collimated light beams 107a and 107b are each incident on a corresponding REMA 102a and 102b. Light 109a and 109b passing through REMAs 102a and 102b contacts masks 108a and 108b, respectively. Masks 108a and 108b include patterns which block portions of the incident light 109a and 109b. Light 111a and 111b transmitted by masks 108a and 108b is conducted by reflective elements 110a and 110b, respectively, and light redirecting element 112 to a projection lens 114. Projection lens 114 focuses the incident light 117 onto a wafer 116 carried by a movable stage 118. A space 120 separates a surface of wafer 116 from projection lens 114. An immersion liquid 122 substantially fills the space 120.

REMAs 102a and 102b each include a slit to allow light to pass through only a portion of the REMA. The slit is able to translate in a direction perpendicular to the incident light beam. The speed of the slit is adjustable and ranges from 400 mm/s to 700 mm/s. The speed of the slit in a specific application is selected based on a size of the slit, an intensity of the light beam and a material being patterned. In some embodiments, the speed of the slit is selected by a user. In some embodiments, the speed of the slit is calculated and controlled by a processor connected to lithography apparatus 100. Light incident 107a and 107b on portions of REMAs 102a and 102b other than the slit is blocked and does not propagate through the REMAs. In some embodiments, lithography apparatus 100 includes more than two REMAs.

Figure 1B:
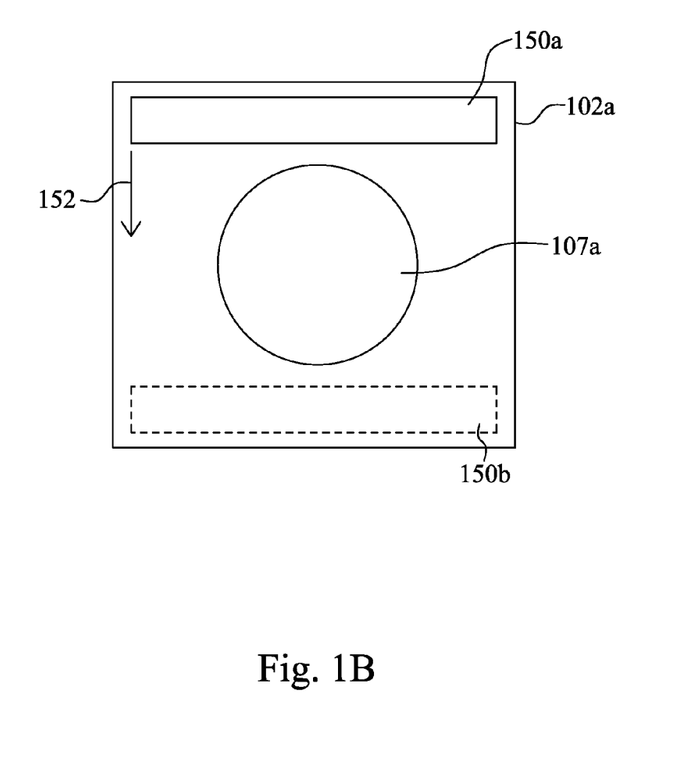
FIG. 1B is a cross-sectional view of a REMA taken along line 1B-1B of FIG. 1A.

The size of the REMAs 102a and 102b is sufficiently large to position the slit out of the incident light beam outside the incident light beams 107a and 107b on either side of the incident light beam 107a and 107b. When the slit is positioned outside the incident light beam, no light propagates through the REMA 102a or 102b. FIG. 1B is a cross-sectional view of REMA 102a taken along line 1B-1B of FIG. 1A. REMA 102a is sufficiently large to position a slit 150a out of a path of incident light beam 107a. Slit 150a indicated by a solid outline is located in a first position outside incident light beam 107a. During operation, slit 150a moves from the first position to a second position indicated by slit 150b having a dashed outline along a movement direction 152. In some embodiments, the relative location of the first position and the second position are reversed.

In some embodiments, light source 104 is a laser light source. In some embodiments, light source 104 is a lamp light source. In some embodiments, a wavelength of light 105 emitted by light source 104 ranges from 13.5 nm to 365 nm. In some embodiments, the wavelength of light 105 emitted by light source 104 is ultraviolet light, including deep ultraviolet light, extreme ultraviolet light or vacuum ultraviolet light. In some embodiments, light source 104 includes an i-line laser, a KrF laser, an ArF laser, an ArFi laser, or other suitable light source.

Beam separating element 106 receives the light beam 105 from light source 104 and emits two collimated beams 107a and 107b. One collimated beam 107a and 107b emitted by beam separating apparatus 106 is incident on each REMA 102a and 102b. In some embodiments, beam separating element 106 divides the light beam 105 into more than two collimated beams. In embodiments where separating element 106 divides the light beam 105 into more than two collimated beams, the number of REMA matches a number of collimated light beams. In some embodiments, beam separating element 106 includes a rotatable mirror to change a propagation direction of the light beam 105. In some embodiments, beam separating element 106 includes a piezoelectric lens that turns on or off based on a control voltage. In some embodiments, the beam separating element 106 includes a prism.

Masks 108a and 108b are positioned to receive light 109a and 109b passing through the slit of REMAs 102a and 102b, respectively. Masks 108a and 108b each include a pattern corresponding to features to be transferred to wafer 116. In some embodiments, mask 108a has a different pattern from mask 108b. In some embodiments, mask 108a has the same pattern as mask 108b. In some embodiments where mask 108a is different from mask 108b, the combined features transferred to the wafer from masks 108a and 108b include features having spacing below the resolution capabilities of a single mask.

Reflective elements 110a and 110b reflect light 111a and 111b transmitted by masks 108a and 108b, respectively, toward light redirecting element 112. In some embodiments, reflective elements 110a and 110b are mirrors. In some embodiments, reflective elements 110a and 110b are prisms. In some embodiments, reflective elements 110a and 110b are wavelength selective. Wavelength selective reflective elements 110a and 110b limit stray light of different wavelengths from entering into the lithography apparatus 100 and adversely impacting the transfer of the patterns from masks 108a and 108b to wafer 116.

Light redirecting element 112 receives the light 113a and 113b reflected by reflective elements 110a and 110b and redirects the light 115 to projection lens 114. In some embodiments, light redirecting element 112 is a mirror. In some embodiments, light redirecting element 112 is a prism. In some embodiments, light redirecting element 112 is wavelength selective.

Projection lens 114 receives light 115 redirected by light redirecting element 112 and focuses the light 117 onto wafer 116. Projection lens 114 reduces the size of the pattern imparted into the light 115 by masks 108a and 108b. In some embodiments, projection lens 114 reduces the size of the pattern to a size three to seven times smaller than the pattern imparted into the light 115 by masks 108a and 108b. In some embodiments, projection lens 114 is a catoptric arrangement. In some embodiments, projection lens 114 is a catadioptric arrangement. In some embodiments, projection lens 114 includes aberration correcting elements. In some embodiments, projection lens 114 includes wavelength selective elements. In some embodiments where light source 104 emits an ultraviolet light beam, projection lens 114 includes refractive elements comprising calcium fluoride. In some embodiments, projection lens 114 has a numerical aperture ranging from 0.6 to 1.35. In some embodiments, projection lens 114 has a focal length ranging from 50 nm to 500 nm.

In some embodiments, wafer 116 is a semiconductor wafer. In some embodiments, wafer 116 is silicon, germanium, gallium nitride, or other suitable material. In some embodiments, wafer 116 has a photoresist layer formed over a surface of the wafer so that light 117 from projection lens 114 is incident upon the photoresist layer. When a photoresist layer is present on wafer 116, the photoresist layer is patterned by light transmitted through projection lens 114. In some embodiments, the photoresist layer is a positive photoresist material. In some embodiments, the photoresist layer is a negative photoresist material.

Movable stage 118 supports wafer 116. Movable stage 118 is capable of translational movement in a plane perpendicular to the direction of the light incident on wafer 116. Movable stage 118 translates wafer 116 so that light from projection lens 114 is incident upon the desired position of the wafer. In some embodiments, movable stage 118 is movable using a stepper motor. In some embodiments, movable stage 118 is movable using a scanning motor. In some embodiments, movable stage 118 comprises a rack and pinion arrangement. In some embodiments, movable stage 118 is driven by a threaded screw arrangement. During the patterning process, movable stage 118 translates wafer 116 in a direction opposite to the movement direction of the slit of reticle masking elements 102a and 102b. By moving wafer 116 in a direction opposite to the slit, the patterning time for each position on the wafer is reduced. In addition, the size of the REMAs 102a and 102b is reduced because the range of motion for the slit is decreased because of the ability to concurrently move wafer 116.

The space 120 between wafer 116 and the proximate end of projection lens 114 is filled with immersion liquid 122. Immersion liquid 122 has a refractive index substantially equal to the refractive index of a last element of projection lens 114 to reduce reflection and refraction at an interface of the projection lens and the air. Reflection of light 117 emitted from projection lens 114 reduces the intensity of light 117 incident on wafer 116, which would increase a time to sufficiently pattern wafer 116 and energy consumption because light source 104 emits a higher intensity light beam. In some embodiments, refraction of light emitted from projection lens 114 causes the pattern transferred to wafer 116 to have increased distortion because light is bent away from an intended direction. In some embodiments, immersion liquid 122 is water. In some embodiments, immersion liquid 122 is oil or other suitable material.

Lithography apparatus 100 facilitates double patterning of wafer 116. Double patterning is a technique used to transfer a desired design to the wafer when features or spacing between features of the desired design are smaller than the resolution capabilities of a single mask. In such instances, the desired design is separated into multiple masks and the pattern of each mask is separately transferred to the wafer. When masks 108a and 108b have different patterns, lithography apparatus 100 is used for double patterning. In some embodiments where the number of collimated beams emitted by beam separation element 106 and REMAs is greater than two, lithography apparatus 100 is used for multiple patterning more than two patterns onto wafer 116.

Figure 2:
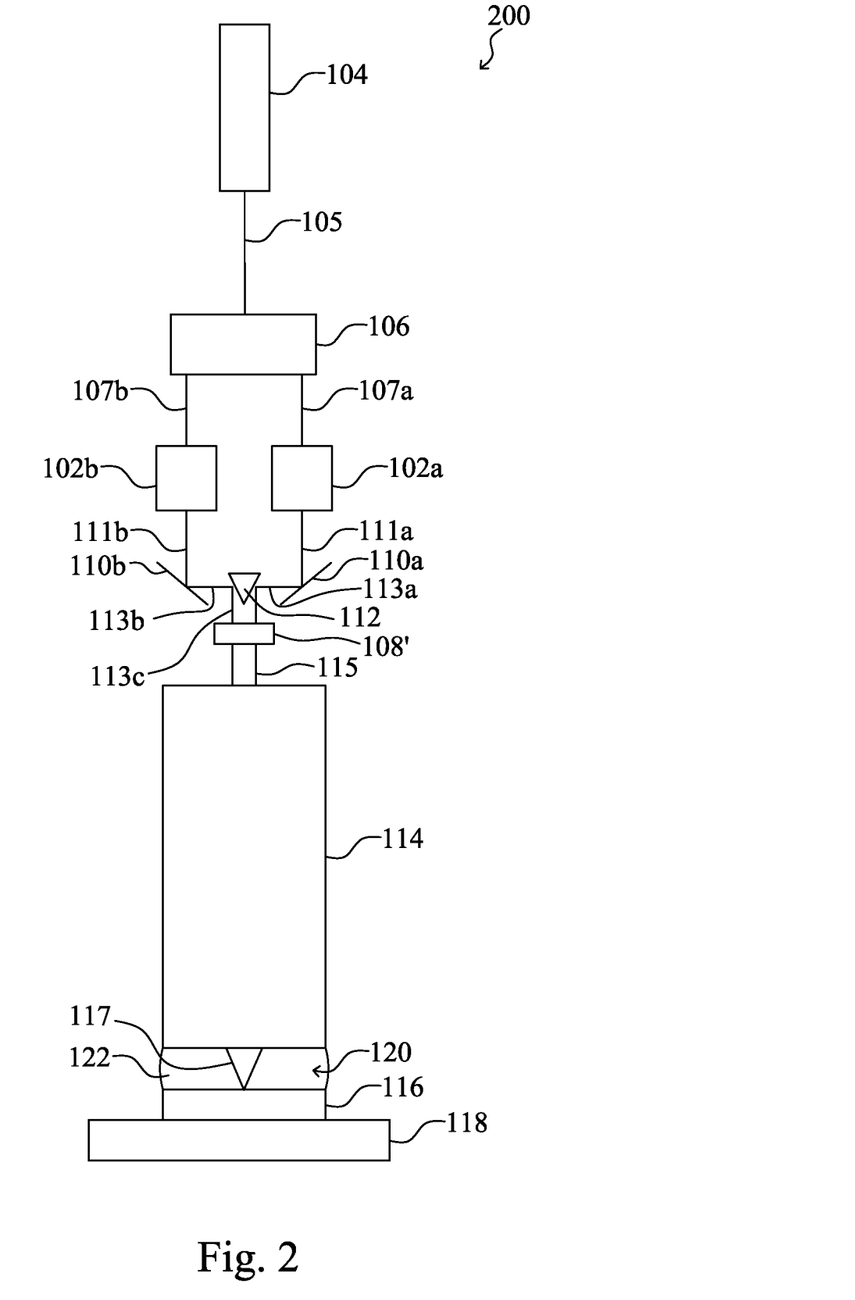
FIG. 2 is a functional diagram of a lithography apparatus having dual reticle edge masking assemblies according to one or more embodiments.

FIG. 2 is a diagram of a lithography apparatus 200 having dual REMAs 102a and 102b. Similar to lithography apparatus 100, lithography apparatus 200 includes light source 104, beam separation element 106, reflective elements 110a and 110b, light redirecting element 112, projection lens 114, wafer 116, movable stage 118 and the space 120 between the wafer and the projection lens is substantially filled with immersion liquid 122. Unlike lithography apparatus 100, lithography apparatus 200 includes a single mask 108' in place of masks 108a and 108b.

Mask 108' is positioned to be contacted by light 113c redirected by light redirecting element 112. Mask 108' includes a pattern design corresponding to features to be transferred to wafer 116. In some embodiments, only a single mask is used to pattern wafer 116. Lithography apparatus 200 uses mask 108' in place of masks 108a and 108b to reduce production cost associated with producing an additional mask. Lithography apparatus 200 has an increased patterning speed in comparison to a conventional lithography apparatus having only a single REMA.

Figure 3:
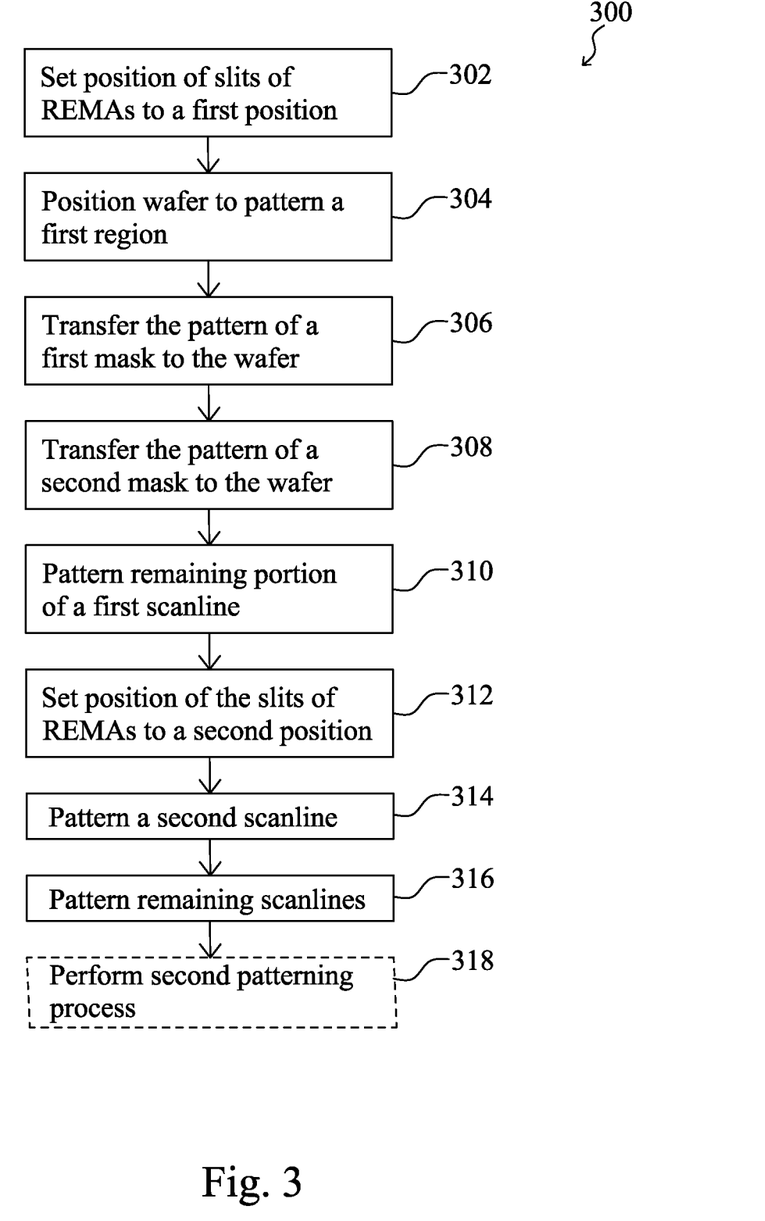
FIG. 3 is a flow chart of a method of a patterning process according to one or more embodiments.

FIG. 3 is a flow chart of a method 300 of patterning a wafer using lithography apparatus 100 (FIG. 1). In operation 302, a position of the slits of REMAs 102a and 102b are set to the first position. The first position is outside the portion of REMAs 102a and 102b contacted by incident light from beam separation element 106 to prevent unintentional patterning of wafer 116.

In operation 304, wafer 116 is positioned by movable stage 118 so that a first region of wafer 116 is patterned by the light transmitted by REMA 102a or 102b and mask 108a or 108b. One of ordinary skill will recognize, in some embodiments, operations 302 and 304 are reversed.

In operation 306, the pattern of mask 108a is transferred to wafer 116 by transmitting light through the slit of REMA 102a while the slit moves from the first position to a second position and wafer 116 moves in the opposite direction from the slit movement. The second position is on the opposite side of the light received from beam separation element 106. For example, the first position is outside the incident light received from beam separation element 106, the second position is outside the incident light on an opposite side of the incident light received from the beam separation element.

Figure 4:
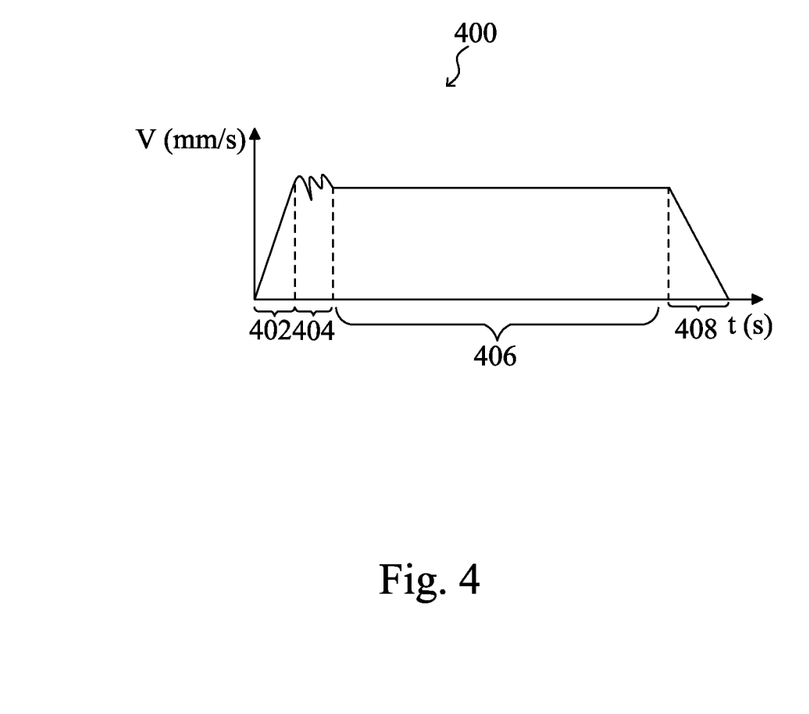
FIG. 4 is a graph of velocity of a slit of a reticle edge masking assembly versus time according to one or more embodiments.

The movement of the slit has four phases. FIG. 4 is a graph of a velocity of the slit versus time. A first phase 402 is a speed up phase, where the slit accelerates from rest at the first position to a target velocity ranging from 400 mm/s to 700 mm/s. A second phase 404 is a settling phase, where the velocity of the slit transitions from accelerating to the target velocity. A third phase 406 is a constant velocity phase, where the slit travels at the target velocity. A fourth phase 408 is a slow down phase, where the slit slows from the target velocity to rest at the second position. In order to accurately transfer the pattern of mask 108a to wafer 116, patterning occurs during third phase 406.

Figure 5:
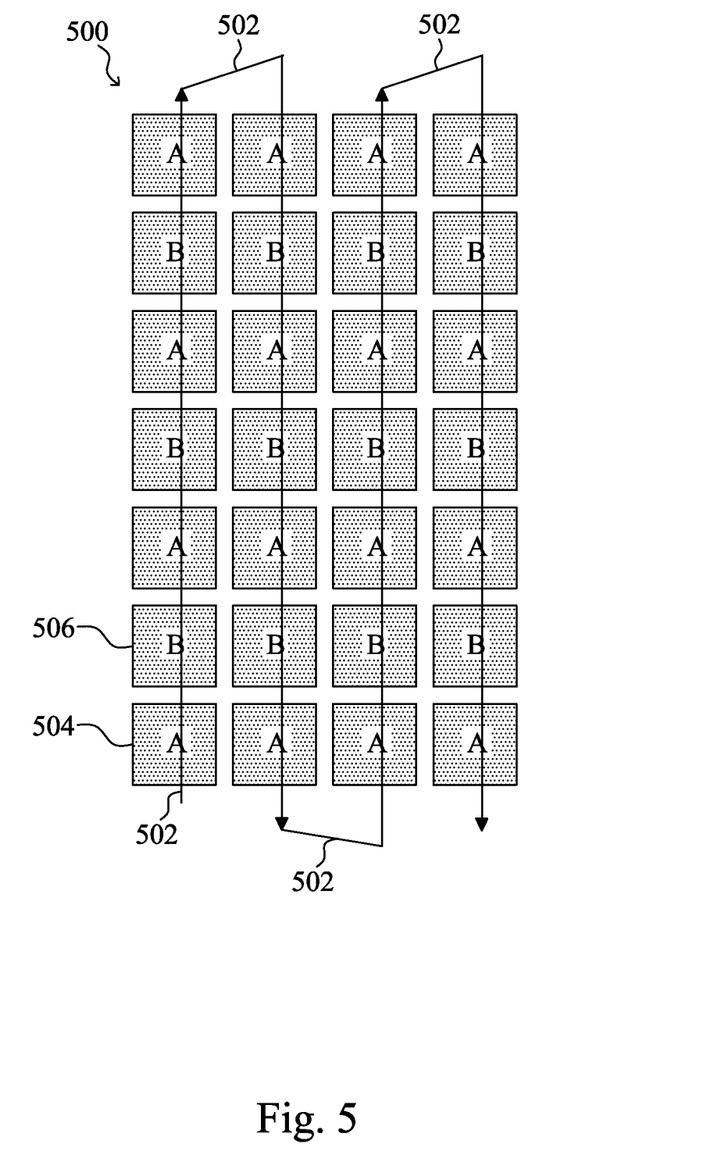
FIG. 5 is a diagram of a scanning path for a patterning process according to one or more embodiments.

Upon completion of operation 306, the pattern of mask 108a is transferred to wafer 116. FIG. 5 is a diagram 500 of a scanning path 502 for a patterning process. Regions 504 and 506 correspond to locations on wafer 116 which are patterned. Letters "A" and "B" in regions 504 and 506 signify which pattern is transferred to a specific region. For example, the letter "A" in region 504 signifies the pattern of mask 108a is transferred to region 504, while the letter "B" in region 506 signifies the pattern of mask 108b is transferred to region 506. Following operation 306, region 504 includes the pattern of mask 108a and region 506 is not patterned.

Returning to method 300, following the transfer of the pattern of mask 108a to wafer 116, the pattern of mask 108b is transferred to wafer 116 by transmitting light through the slit of REMA 102b while the slit moves from the first position to a second position while wafer 116 continues to move in the opposite direction from the slit movement, in operation 308. Also during operation 308 the slit of REMA 102a is returned to the first position. In some embodiments, a shutter is used to block light along an optical path of REMA 102a during the process of the slit returning to the first position. The shutter prevents unintentional patterning of wafer 116. In some embodiments, the shutter is positioned at an outlet of beam separating element 106. In some embodiments, the shutter is positioned in REMA 102a. In some embodiments, the shutter is a separate element disposed along the optical path of REMA 102a.

Similar to operation 306, patterning of wafer 116 occurs during the third phase 406 of the movement the slit of REMA 102b. Following operation 306, region 504 includes the pattern of mask 108a and region 506 includes the pattern of mask 108b. In embodiments where masks 108a and 108b have the same pattern, regions 504 and 506 will have the same pattern.

In some embodiments, the slit of REMA 102b begins moving prior to completion of the patterning of region 504 (FIG. 5). By beginning the movement of the slit of REMA 102b prior to the completion of patterning of region 504, the slit of REMA 102b reaches constant velocity concurrently with the completion of patterning of region 504. This arrangement avoids delaying the patterning of region 506 while the slit of REMA 102b reaches the target velocity.

One of ordinary skill will recognize, in some embodiments, the order of patterning using REMAs 102a and 102b is reversed. In some embodiments, wafer 116 is first patterned using REMA 102a and mask 108a such that region 504 (FIG. 5) has the pattern of mask 108a. In some embodiments, wafer 116 is first patterned using REMA 102b and mask 108b such that region 504 has the pattern of mask 108b.

In operation 310, remaining regions of a first scan line of wafer 116 are patterned. The patterning process is repeated in alternating fashion for each region along the first scan line of wafer 116. Each region is patterned using a different REMA 102a or 102b and mask 108a or 108b combination than a previous region. Diagram 500 (FIG. 5) depicts that the first scan line includes seven regions and each region has the pattern of a different mask 108a or 108b from the previous region. In some embodiments, the first scan line includes more than seven regions. In some embodiments, the first scan line includes less than seven regions. Diagram 500 depicts the first scan line as a column. In some embodiments, the first scan line is a row. In some embodiments, the first scan line is any series of continuously patterned regions. During the patterning of each region, the slit of REMA 102a or 102b not currently patterning wafer 116 is returned from the second position to the first position and prepared for patterning a next region. A shutter is positioned to block light propagating through REMA 102b during the process of returning the slit of REMA 102b to the first position. In some embodiments, the shutter is positioned at an outlet of beam separating element 106. In some embodiments, the shutter is positioned in REMA 102b. In some embodiments, the shutter is a separate element disposed along an optical path of REMA 102b.

In operation 312, the slits of REMAs 102a and 102b (FIG. 1) are set to the second position to prepare to pattern a second scan line. Diagram 500 (FIG. 5) depicts scanning path 502 as an S-shaped path. To pattern the second scan line, the movement direction of the slits of REMAs 102a and 102b as well as wafer 116 are reversed. When patterning the second scan line, the slits of REMAs 102a and 102b move from the second position to the first position and wafer 116 moves in the opposite direction with respect to the movement of the slits, i.e., wafer 116 moves in a reverse direction from the movement direction during patterning of the first scan line. In contrast to the patterning of the first scan line, the slits of REMAs 102a and 102b return to the second position following the transfer of the pattern of mask 108a or 108b to wafer 116 during patterning of the second scan line.

In operation 314, the second scan line is patterned. The second scan line is patterned in a manner similar to the patterning of the first scan line except the movement directions are reversed. For example, while REMA 102a acts to transfer the pattern of mask 108a to a region of wafer 116, the slit of REMA 102b returns to the second position while wafer 116 continues to move in the opposite direction from the slits.

In operation 316, the remaining scan lines are patterned. The movement directions for the slits of REMAs 102a and 102b as well as wafer 116 are reversed for the patterning of each subsequent scan line. Diagram 500 (FIG. 5) depicts four scan lines. In the embodiment of diagram 500, the direction of movement for the slits of REMAs 102a and 102b as well as wafer 116 during the patterning of the first scan line are the same as during the patterning of a third scan line. Similarly in the embodiment of diagram 500, the direction of movement for the slits of REMAs 102a and 102b as well as wafer 116 during the patterning of the second scan line are the same as during the patterning of a fourth scan line. Diagram 500 depicts each scan line having the same number of regions. In some embodiments, scan lines have a different number of regions. In some embodiments where a wafer is circular in shape, the scan lines near a perimeter of the wafer have fewer regions than scan lines in a central portion of the wafer.

In optional operation 318, a second patterning process is performed on wafer 116. In the second patterning process, the opposite REMA and mask combination from the first patterning process are used. For example, region 504 (FIG. 5) is patterned by REMA 102b and mask 108b during the second patterning process. Following optional operation 318, each region of wafer 116 includes the pattern of mask 108a and mask 108b. Thus, method 300 performs double patterning on wafer 116. In some embodiments where the number of REMA and collimated beams is greater than two, more than two patterning processes are performed to transfer more than two patterns to wafer 116.

While method 300 is described in relation to lithography apparatus 100, one of ordinary skill will recognize the operations in method 300 are also applicable to lithography apparatus 200. A wafer patterned by lithography apparatus 200 operating by method 300 will have the same pattern in each region of the wafer.

In addition to double patterning wafer 116, method 300 reduces undesired effects of particles on wafer 116. In some instances, particles or bubbles are formed during a manufacturing process. If the particles remain in immersion liquid 122, the particles can prevent patterning illumination from contacting wafer 116. In previous techniques having short scan lines, the particles are trapped between projection lens 114 and wafer 116. If the particles are close to wafer 116, the particles block light which prevents accurate patterning of wafer 116. If the particles are suspended in immersion liquid 122 the particles scatter incident light which decreases the precision of the pattern transferred to wafer 116. By using longer scan lines, in comparison to previous techniques, the particles are effectively swept away from projection lens 114 and wafer 116 by the movement of movable stage 118. Thus, the longer scan lines increase the precision of the pattern transferred to wafer 116 by reducing the impact of the particles on the patterning process.

In conventional arrangements having only one REMA, the lithographic arrangement reverses movement directions for a slit of the single REMA and a wafer after patterning each region. This reversal limits the conventional arrangement to scan lines have a single region. The single region scan line results in a build up of particles in an immersion liquid which increases the risk of particles blocking patterning illumination or adhering to the wafer.

Method 300 enables longer scan lines than the conventional arrangement, which reduces the concentration build up of particles in the immersion liquid. The reduced concentration build up decreases the risk of particles blocking patterning illumination or adhering to the wafer.

Method 300 also increases the production speed versus conventional arrangements. As discussed above, to precisely transfer the pattern of masks 108a and 108b to wafer 116, the patterning occurs during a constant velocity phase of the slit movement. In the conventional arrangement, the patterning process must be stopped between the patterning of each region. For example, for a slit moving from a first position to a second position in a conventional arrangement, the patterning process is stopped while the slit slows to a stop at the second position. The patterning process remains stopped while the slit speeds up from the second position and settles to the target velocity for patterning a subsequent region. Additionally, the patterning process is delayed by the time to move the wafer between scan lines. Because the scan line of the conventional arrangement includes only a single region, a number of scan lines in a conventional arrangement is significantly higher than a number of scan lines of method 300.

Conversely, method 300 is capable of patterning several regions without stopping the patterning process. By using two separate REMAs, method 300 is able to pattern a region of the wafer by using one REMA while the other REMA reaches a constant velocity in preparation for patterning a subsequent region of the wafer. The reduced number of scan lines because of the ability to switch between REMAs and to reset a position of the slit of one REMA while the other REMA is patterning the wafer also decreases the total amount of delay in the patterning process necessary to adjust the wafer position to subsequent scan lines.

One aspect of this description relates to a lithography apparatus. The lithography apparatus includes a plurality reticle edge masking assemblies (REMAs), wherein each REMA of the plurality of REMAs is positioned to receive one of a plurality of light beams, and each REMA of the plurality of REMAs comprises a movable slit for passing the received light beam therethrough. The lithography apparatus further includes a controller for controlling a speed of the movable slit based on a size of the movable slit, an intensity of the one or more collimated light beams, or a material to be patterned. The lithography apparatus further includes a single mask having a single pattern, wherein the mask is configured to receive light from every REMA of the plurality of REMAs. The lithography apparatus further includes a projection lens configured to receive light transmitted through the single mask, wherein the lithography apparatus is configured to introduce an immersion liquid into a space adjacent to the projection lens.

Another aspect of this description relates to a method of patterning a wafer. The method includes transmitting each light beam of a plurality of light beams through a movable slit of corresponding reticle edge masking assembly (REMA) of a plurality of REMAs. The method further includes controlling a movement speed of the movable slit of each REMA of the plurality of REMAs based on a size of the movable slit, an intensity of the plurality of light beams or a material being patterned. The method further includes passing each light beam of the plurality of light beams through a single mask having a single pattern to form a patterned light beam. The method further includes focusing the patterned light beam on a first region of a wafer to form a first patterned region. The method further includes moving the wafer following the patterning of the first region using a movable stage, wherein the movable stage supports the wafer.

Still another aspect of this description relates to a method of patterning a wafer. The method includes transmitting each light beam of a plurality of light beams through a movable slit of corresponding reticle edge masking assembly (REMA) of a plurality of REMAs. The method includes controlling a movement speed of the movable slit of each REMA of the plurality of REMAs based on a size of the movable slit, an intensity of the plurality of light beams or a material being patterned. The method includes passing each light beam of the plurality of light beams through a single mask having a single pattern to form a patterned light beam. The method includes sequentially focusing the patterned light beam on each region of a plurality of regions of a wafer. The method further includes moving the wafer using a movable stage, wherein the movable stage supports the wafer.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A lithography apparatus comprising:
   a plurality of reticle edge masking assemblies (REMAs), wherein each REMA of the plurality of REMAs is positioned to receive one of a plurality of light beams, and each REMA of the plurality of REMAs comprises a movable slit for passing the received light beam therethrough;
   a controller for controlling a speed of the movable slit based on a size of the movable slit, an intensity of the one or more collimated light beams, or a material of an object to be patterned;
   a single mask having a single pattern, wherein the mask is configured to receive light from every REMA of the plurality of REMAs;
   a projection lens configured to receive light transmitted through the single mask.

2. The lithography apparatus of claim 1, further comprising:
   a movable stage for supporting a wafer.

3. The lithography apparatus of claim 1, further comprising an ultraviolet light source configured to introduce light incident on each REMA of the plurality of REMAs.

4. The lithography apparatus of claim 1, wherein the movable slit of at least one REMA of the plurality of REMAs is capable of moving outside a location for receiving light beam.

5. The lithography apparatus of claim 1, further comprising a plurality of reflective elements configured to combine light from each REMA of the plurality of REMAs to be incident on the single mask.

6. The lithography apparatus of claim 5, wherein the plurality of reflective elements comprises at least one prism.

7. The lithography apparatus of claim 1, wherein the projection lens has a focal length ranging from about 50 nanometers (nm) to about 500 nm.

8. A method of patterning a wafer, the method comprising:
   transmitting each light beam of a plurality of light beams through a movable slit of corresponding reticle edge masking assembly (REMA) of a plurality of REMAs;
   controlling a movement speed of the movable slit of each REMA of the plurality of REMAs based on a size of the movable slit, or an intensity of the plurality of light beams;
   passing each light beam of the plurality of light beams through a single mask having a single pattern to form a patterned light beam;
   focusing the patterned light beam on a first region of a wafer to form a first patterned region; and
   moving the wafer following the patterning of the first region using a movable stage, wherein the movable stage supports the wafer.

9. The method of claim 8, wherein moving the wafer comprises moving the wafer in a direction opposite to a movement direction of the movable slit of at least one REMA of the plurality of REMAs.

10. The method of claim 9, wherein moving the wafer comprises moving the wafer simultaneously with moving the movable slit of the at least one REMA of the plurality of REMAs.

11. The method of claim 8, further comprising focusing the patterned light beam on a second region of the wafer to form a second patterned region different from the first patterned region.

12. The method of claim 11, further comprising moving the movable slit of at least one REMA of the plurality of REMAs beyond a location of incidence for a corresponding light beam of the plurality of light beams after focusing the patterned light beam on the first region of the wafer and before focusing the patterned light beam on the second region of the wafer.

13. The method of claim 11, wherein focusing the patterned light beam on the first region of the wafer comprises focusing light transmitted by a first REMA of the plurality of REMAs focusing the patterned light beam on the second region of the wafer comprises focusing light transmitted by a second REMA of the plurality of REMAs different from the first REMA.

14. The method of claim 8, wherein focusing the patterned light beam comprises transmitting the patterned light beam through an immersion liquid.

15. The method of claim 8, wherein controlling the movement speed of the movable slit of each REMA of the plurality of REMAs comprises increasing a speed of the movable slit from a resting position to a target velocity in a location outside a location of incidence of a corresponding light beam of the plurality of light beams.

16. The method of claim 15, wherein controlling the movement speed of the movable slit of each REMA of the plurality of REMAs comprises transitioning from increasing the speed of the movable slit to maintaining the target velocity outside the location of incidence of the corresponding light beam of the plurality of light beams.

17. A method of patterning a wafer, the method comprising:
- transmitting each light beam of a plurality of light beams through a movable slit of corresponding reticle edge masking assembly (REMA) of a plurality of REMAs;
- controlling a movement speed of the movable slit of each REMA of the plurality of REMAs based on a size of the movable slit, or an intensity of the plurality of light beams;
- passing each light beam of the plurality of light beams through a single mask having a single pattern to form a patterned light beam;
- sequentially focusing the patterned light beam on each region of a plurality of regions of a wafer; and
- moving the wafer using a movable stage, wherein the movable stage supports the wafer.

18. The method of claim 17, wherein moving the wafer comprises moving the wafer simultaneously with the sequential focusing.

19. The method of claim 17, wherein sequentially focusing the patterned light beam comprises focusing the patterned light beam on a first region of the wafer of the plurality of regions of the wafer using light transmitted through a first REMA of the plurality of REMAs, and focusing the patterned light beam on a second region of the wafer of the plurality of regions of the wafer using light transmitted through a second REMA of the plurality of REMAs, and the second REMA is different from the first REMA.

20. The method of claim 19, wherein focusing the patterned light beam on the second region of the wafer comprises:
- closing a shutter in the first REMA; and
- returning a movable slit of the first REMA to a starting location.

* * * * *